(12) United States Patent
Gimmi et al.

(10) Patent No.: US 6,579,371 B1
(45) Date of Patent: Jun. 17, 2003

(54) EXHAUST FLOW CONTROL SYSTEM

(75) Inventors: Richard C. Gimmi, Gresham, OR (US); James E. Cossitt, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 20 days.

(21) Appl. No.: 09/666,507

(22) Filed: Sep. 20, 2000

(51) Int. Cl.$^7$ ............................................. B05C 11/10
(52) U.S. Cl. ..................... 118/677; 110/679; 110/668; 110/707; 110/61
(58) Field of Search ............................. 118/50, 52, 320, 118/663, 677, 679, 58, 61, 326, 707; 427/240, 425, 8, 294; 73/861.77, 861.78, 861.85, 861.89, 861.94

(56) References Cited

U.S. PATENT DOCUMENTS 4,177,673 A * 12/1979 Krueger .................. 73/861.85
6,000,862 A * 12/1999 Okuda et al. ................ 396/579
6,189,390 B1 * 2/2001 Platt ........................ 73/861.66

FOREIGN PATENT DOCUMENTS

JP           2000232050       *  8/2000

\* cited by examiner

Primary Examiner—Richard Crispino
Assistant Examiner—George R Koch, III
(74) Attorney, Agent, or Firm—Luedeka, Neely & Graham PC

(57) ABSTRACT

A method of applying a layer of material to a substrate. The substrate is received with a chuck, and the material is dispensed. The substrate is spun on the chuck, spreading the material and conveying a surplus of the material away. The surplus of the material conveyed away is entrained into an exhaust stream. A pressure drop is created in the exhaust stream across a vane anemometer. The blow back of the entrained surplus of the material from a downstream position in the exhaust system to the substrate is thereby reduced.

10 Claims, 2 Drawing Sheets

EXHAUST FLOW CONTROL SYSTEM

TECHNICAL FIELD

This invention relates to the field of application techniques for flowable material. More particularly, this invention relates to an improved exhaust flow control in a photoresist application system.

BACKGROUND OF THE INVENTION

One of the central and recurring processes by which integrated circuits are formed is that of applying a coating of photosensitive material (typically called photoresist) to the substrate on which the integrated circuits are formed, patterning and developing the photosensitive material, and then selectively processing the underlying portions of the integrated circuits exposed in the patterned portions of the layer of photosensitive material. This series of process steps is repeated over and over again, with many different variations, during the process of fabricating the integrated circuits. Therefore, any problem with the photolithography processing of the substrates tends to have dramatic and far reaching effect on the cost of the manufacturing process and the integrity of the integrated circuits produced.

Traditionally, substrates are coated with the layer of photoresist using a photoresist application system. A photoresist application system optionally includes a number of components to apply and set the photoresist layer to the substrate. A photoresist dispenser dispenses the photoresist onto the top surface of the substrate. After the desired amount of photoresist is dispensed onto the substrate, a chuck holding the substrate is ramped up according to a predetermined acceleration profile to one or more predetermined rotational rates. The acceleration and rotation of the substrate causes the photoresist to spread across the surface of the substrate. Excess photoresist is shed from the substrate at it spreads out to the edges of the substrate, and then off of the edges of the substrate.

The excess photoresist that is spun off of the substrate enters a cup that is disposed around the substrate, and which is a part of an exhaust system. The exhaust system uses an exhaust stream of gas, typically ambient air, to help drawn the excess photoresist down through the exhaust system and away from the substrate to a collection point, such as a sump. The flow of the exhaust stream helps to reduce a blow back of the excess photoresist back onto the substrate. When blow back occurs, the effected areas of the substrate do not expose or develop properly and the substrate must be reworked or the quality of the integrated circuits underlying the effected areas tends to be compromised. Thus, the exhaust stream plays a relatively important role in ensuring that the photoresist coating process proceeds in a proper manner.

As generally indicated above, the excess photoresist has a tendency to blow back onto the substrate if the pressure differential of the exhaust stream through the exhaust system becomes positive. Therefore, it is desirable for the exhaust stream pressure to decrease along the length of the exhaust system. However, even when there is a gradual decrease in pressure along the length of the exhaust system, various temporary and spurious conditions can cause droplets of photoresist to blow back onto the substrate.

Thus, there is a need for a system and a method for applying photoresist to a substrate that reduces blow back of the entrained portion of the excess amount of the flowable material from a downstream position in:the exhaust system to the substrate.

SUMMARY OF THE INVENTION

The above and other needs are provided by a method of applying a layer of a flowable material to a substrate. The substrate is received with a rotatable chuck, and an amount of the flowable material is dispensed on to the substrate. The substrate is spun on the rotatable chuck, thereby spreading the flowable material across the substrate and conveying a surplus amount of the flowable material away from the substrate. An exhaust stream is created with a vacuum source. At least a portion of the surplus amount of the flowable material conveyed away from the substrate is entrained into the exhaust stream, which exhaust stream is conveyed into an exhaust system. A pressure drop is created in the exhaust stream across a vane anemometer within the exhaust system. The blow back of the entrained portion of the surplus amount of the flowable material from a downstream position in the exhaust system to the substrate is thereby reduced.

Thus, positioning the vane anemometer in the exhaust system tends to create a sudden and distinct pressure drop across the vane anemometer, which tends to reduce the occurrence of blow back of the flowable material from the portion of the exhaust system that is downstream from the vane anemometer, and which is at a relatively lower pressure, to the portion of the exhaust system that is upstream from the vane anemometer, and which is at a relatively higher pressure, and which is where the substrate is processed.

In various preferred embodiments, the flowable material is photoresist, the substrate is a semiconductor wafer, and the rotatable chuck and the exhaust system are components of a photoresist application system. The external surface of the vanes of the vane anemometer are preferably made of a material that is resistant to the adherence of the flowable material. Most preferably, the vane anemometer has magnets in the tips of the vanes, and the rotational rate of the vane anemometer is detected with sensors located outside of the exhaust system, which sensors detect the magnets located within the vanes of the vane anemometer.

In an especially preferred embodiment, a signal corresponding to the velocity of the exhaust stream in the exhaust system is produced and reported. An alarm condition is signaled when the velocity of the exhaust stream in the exhaust system is less than a set, point velocity. In other embodiments the application of the flowable material to additional substrates is prohibited when the velocity of the exhaust stream in the exhaust system is less than the set point velocity.

In an apparatus for applying a layer of the flowable material to the substrate, a rotatable chuck receives the substrate, and a dispensing unit dispenses an amount of the flowable material onto the substrate, The rotatable chuck rotates the substrate and thereby spreads the flowable material across the substrate, and conveys a surplus amount of the flowable material away from the substrate. An exhaust system receives the surplus amount of the flowable material. A vacuum source creates an exhaust stream within the exhaust system, and the exhaust stream entrains at least a portion of the surplus amount of the flowable material conveyed away from the substrate and received by the exhaust system. A vane anemometer disposed within the exhaust system creates a pressure drop in the exhaust stream across the vane anemometer within the exhaust system, and thereby reduces blow back of the entrained portion of the surplus amount of the flowable material from a downstream position in the exhaust system to the substrate.

BRIEF DESCRIPTION OF THE DRAWINGS

Further advantages of the invention will become apparent by reference to the detailed description of preferred embodiments when considered in conjunction with the following drawings, which are not to scale so as to more clearly depict the details, wherein like reference characters designate like or similar elements throughout the several views, and wherein.

DETAILED DESCRIPTION OF THE INVENTION

Figure 1:
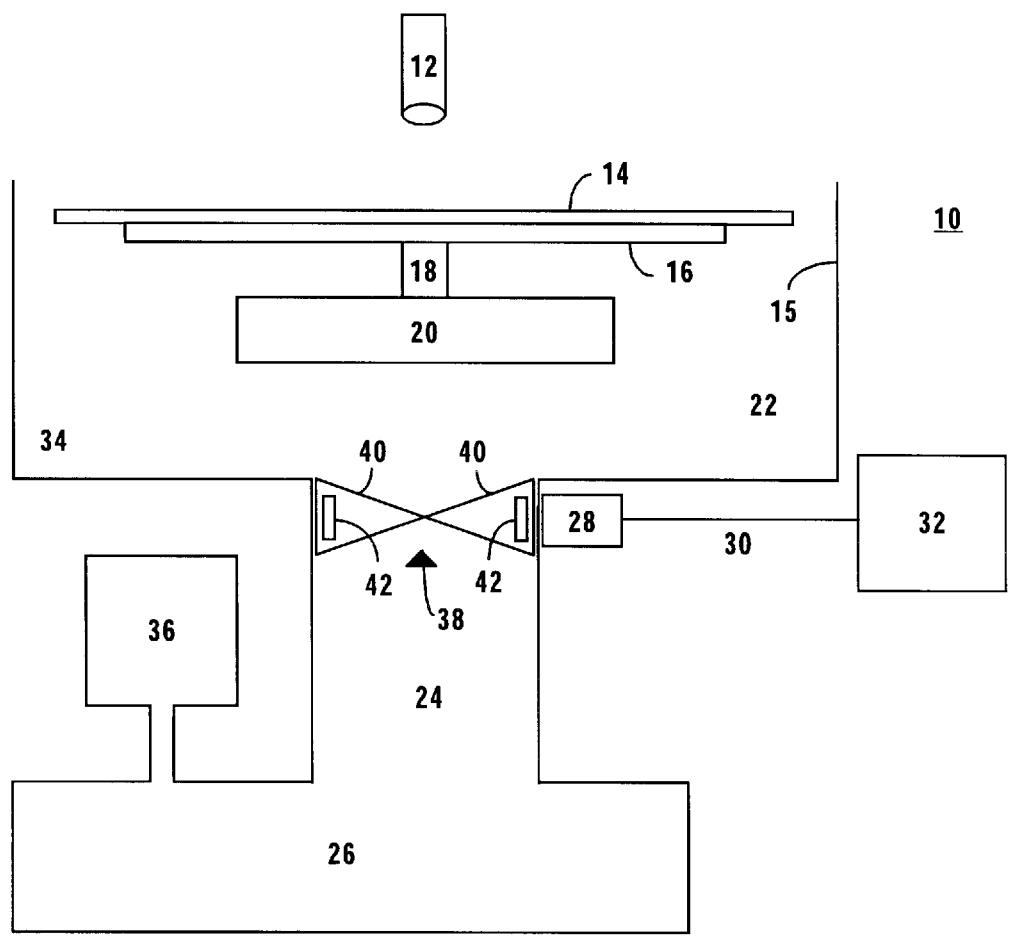
FIG. 1 is a cross sectional view of a photoresist application system according to a first embodiment of the invention.

Referring now to FIG. 1, there is depicted a first embodiment of a photoresist application system 10 according to the present invention. In its basic configuration the photoresist application system 10 consists of a relatively few different elements. However, in more elaborate embodiments a great number of elements are selectively added to the basic elements described herein. Thus, the embodiment described herein is considered to be exemplary of the basic elements and not an exhaustive recitation of all the different combinations of elements that may be added to the photoresist application system 10.

A photoresist dispensing tube 12 dispenses an amount of photoresist on to the substrate 14. Preferably, the amount of photoresist dispensed from the photoresist dispensing tube 12 is a metered amount, which is dependent upon one or more of several different variables, such as the size of the substrate 14, the desired thickness of the resultant layer of photoresist on the substrate 14, and the type of photoresist dispensed from the photoresist dispensing tube 12. Preferably, the photoresist is dispensed from the photoresist dispensing tube 12 while the substrate 14 is stationary, but in alternate embodiments the photoresist is dispensed from the photoresist dispensing tube 12 while the substrate 14 is rotating at some relatively low rotation rate. The photoresist is also preferably dispensed in a position on the top surface of the substrate 14 that is substantially near the center of the substrate 14, which is also substantially the center for rotation of the substrate 14, as described in more detail below. However, in alternate embodiments the photoresist is dispensed in various locations across the top surface of the substrate 14.

A rotatable chuck 16 holds the substrate while the photoresist is dispensed from the photoresist dispensing tube 12. The rotatable chuck 16 is preferably a vacuum chuck, in that a slight vacuum is drawn through the rotatable chuck 16 and applied to the back surface of the substrate 14, which back surface resides against an upper surface of the rotatable chuck 16. In this manner the substrate 14 is held securely against the rotatable chuck 16, to a degree sufficient that the substrate 14 does not separate from the rotatable chuck 16 during subsequent rotational processing of the substrate 14, but not to the point that the substrate 14 is in any way damaged by the force of the vacuum applied between the top surface of the rotatable chuck 16 and back surface of the substrate 14.

At some point, either before, during or after dispensing the photoresist from the photoresist dispensing tube 12 onto the surface of the substrate 14, the substrate 14 is rotated to assist in spreading the pool of photoresist dispensed onto the substrate 14 across the surface of the substrate 14. Again, one of the purposes of the photoresist application system 10 is to produce a relatively uniform layer of photoresist across the entire top surface of the substrate 14. In one embodiment, the substrate 14 is rotated by rotating the rotatable chuck 16, such as by connecting the rotatable chuck to a motor 20 with a spindle 18. Of course, in other embodiments, other means may be used to power the rotation of the rotatable chuck 16.

To ensure that a sufficient amount of photoresist is provided to form a uniform layer of photoresist with a desired thickness across the surface of the substrate 14, an excess amount of photoresist is delivered onto the substrate 14 through the photoresist dispensing tube 12. As the substrate 14 is rotated by the rotatable chuck 16, the surplus photoresist, which is not required to form the uniform layer of photoresist across the surface of the substrate 14, is flung off of the substrate 16 from the outside edges of the substrate 16. The surplus photoresist typically impacts against the sidewalls 15 of the photoresist application system 10.

Preferably at all time during processing, an exhaust stream is drawn through the photoresist processing system 10 by a vacuum source 36, such as a vacuum pump. The exhaust stream is preferably drawn from the ambient air around the photoresist processing system 10, and through an exhaust system 34, that includes a cup 22, a passage 24, and a sump 26. The exhaust stream is preferably drawn at a rate, and the elements of the exhaust system 34 are preferably designed with a configuration, such that the exhaust stream flows in a substantially laminar manner, especially around the substrate 14. Laminar flow of the exhaust stream is preferred because it is desired that none of the surplus photoresist that is flung off of the substrate 14 be carried back onto the substrate 14 by turbulence within the exhaust stream.

In its most preferred operation, the exhaust system conveys the surplus photoresist away from the substrate 14 by delivering it down through the exhaust system to the sump 26. Although the sump 26 is depicted in FIG. 1 as relatively near to the substrate 14, it is appreciated that this for convenience in the drawings, and that in actual practice the sump 26 is preferably much farther away from the substrate 14.

The exhaust stream created in the exhaust system 34 aids in the flow: of the surplus photoresist through the exhaust system 34 toward the sump 26. As surplus photoresist is flung off of the substrate 14, some amount of the surplus photoresist is entrained in the exhaust stream and drawn down through the exhaust system 34. The surplus photoresist that impacts against the side wall 15 of the photoresist application system 10 tends to build up on the side wall 15 until it also begins to move down through the exhaust system 34 under the influence of various forces, including gravity and the flow of the exhaust stream. As the photoresist on the sidewalls 15 of the photoresist application system 10 builds up, a certain amount of the surplus photoresist may come loose from the sidewalls 15 and also be entrained in the exhaust stream.

It is preferred that once the surplus photoresist is flung off of the substrate 14, the surplus photoresist is conveyed away from the substrate 14 through the exhaust system 34 to the sump 26, and does not further contact the substrate 14. However, various conditions within the exhaust system 34 may work against this preference. For example, because of the location of the vacuum source 36, a negative pressure preferably exists through the exhaust system 34. By this it is meant that when the pressures at any two points within the exhaust system 34 are compared, the point that is closer to the vacuum system 36, the downstream position, preferably has a pressure that is at least slightly lower than the pressure of the point that is closer to the substrate 14, the upstream position. In this manner, the flow of the exhaust stream is preferably always directed away from the substrate 14 at one end of the exhaust system 34 and toward the vacuum source 36 at the other end of the exhaust system 34. This flow characteristic of the exhaust stream tends to reduce the amount of surplus photoresist entrained in the exhaust stream that blows back onto the substrate 14.

However, if the pressure through the exhaust system 34 becomes positive, then the amount of surplus photoresist entrained in the exhaust stream that blows back onto the substrate 14 tends to increase. By a positive pressure it is meant that when the pressures at any two points within the exhaust system are compared, the point that is closer to the vacuum system 36 has a pressure that is not less than the pressure at the point that is closer to the substrate 14. When such a positive pressure exists, the flow of the exhaust stream tends to be directed toward the. substrate 14 at what should be the upstream end of the exhaust system 34 and away from the vacuum source 36 at what should be the downstream end of the exhaust, system 34. This flow characteristic of the exhaust stream tends to increase the amount of surplus photoresist entrained in the exhaust stream that blows back onto the substrate 14, and thus is an undesirable flow characteristic.

According to a preferred embodiment of the invention, an element is added to the photoresist application system 10 to create a relatively sharp pressure drop at a given position within the exhaust system 34. In this manner, a relatively larger positive pressure is required to produce a flow of the exhaust stream toward the substrate 14 and blow back of the surplus photoresist onto the substrate 14. In a most preferred embodiment, the pressure drop is created by one or more vane anemometer 38.

The vane anemometer 38 preferably has one or more vanes 40, which are disposed at an angle to the flow of the exhaust stream within the exhaust system 34. As the exhaust stream flows past the vane anemometer 38, the vanes 40 of the vane anemometer 38 rotate. The rotation of the vanes 40 of the vane anemometer 38 is preferably proportional to the velocity of the flow of the exhaust stream within the exhaust system 34, as described in more detail below.

In a most preferred embodiment, the vanes 40 of the vane anemometer 38 are covered with or constructed of a material that tends to not be wet by the photoresist within the exhaust system 34, such as the photoresist that is entrained within the exhaust stream. In other words, the material that covers the vanes 40 of the vane anemometer 38 is resistant to the adherence of the photoresist, and the photoresist is preferably shed by and not absorbed by the material that covers the vanes 40 of the vane anemometer 38. A material such as Teflon tends to resist the absorption of most photoresist material. However, in embodiments where the invention is applied to applications other than photoresist application systems 10, then another material may preferably be used, as selected at least in part according to the specific characteristics of the flowable material that is within the exhaust system 34.

Because at least a small amount of energy is absorbed from the exhaust stream to produce the rotation in the vane anemometer 38, and because the presence of the vane anemometer 38 in the exhaust system 34 tends to restrict the flow of the exhaust stream to at least some degree, the pressure in the cup 22 of the exhaust system 34 tends to be at least slightly higher than the pressure in the passage 24 or the sump 26 of the exhaust system 34. Thus, a larger positive pressure is required to produce a blow back of the entrained photoresist onto the substrate 14, and smaller variations within the pressure characteristics of the exhaust system 34 tend to not rise to a level that is sufficient to create a blow back condition. In this manner the vane anemometer 38 tends to reduce the amount of photoresist that blows back onto the substrate 14.

However, in additional preferred embodiments of the invention, additional use is made of the vane anemometer 38. In these additional embodiments, the vane anemometer 38 is used to detect the velocity of the exhaust stream within the exhaust system 34. This is accomplished by detecting the speed of the rotation of the vanes 40 of the vane anemometer 38, which as described briefly above, is preferably proportional to the velocity of the flow of the exhaust stream within the exhaust system 34. In this manner, the vane anemometer 38 is used to detect the velocity of the exhaust stream, which detected velocity is preferably used to help control the use of the photoresist application system 10, as described below.

The rotational speed of the vane anemometer 38 can be detected in a number of different ways. For example, a mechanical linkage can be made between the rotating vanes 40 and a sensor. However, in the preferred embodiment, no mechanical connections exist between the vanes 40 and the rotational speed sensing mechanism. Further, it is preferred that no additional elements of the velocity sensing mechanism exist within the exhaust system 34.

In a most preferred embodiment, elements such as magnets 42 are disposed within the vanes 40 of the anemometer 38. Most preferably, the magnets 42 reside at the tips of the vanes 40 of the anemometer 38. The magnets 42 may be attached to the outside of the vanes 40, or the vanes 40 may be constructed of the magnets 42, or the magnets 42 may be embedded within the vanes 40. Preferably, the magnets 42 reside within the cladding material of the vanes 40, which cladding material is preferably substantially non-wettable by the photoresist, as described above. In this manner, the magnets 42 tend to not collect photoresist over time, which would tend to alter the rotational characteristics of the vane anemometer 38 over time; Alternately, the magnets 42 are additionally clad with the same or another material that is substantially non-wettable by the photoresist, or are themselves constructed of a material that is non-wettable by the flowable material within the exhaust system 34.

Preferably a sensor 28, such as a coil, is disposed outside of the exhaust system 34 in proximity to the vane anemometer 38, and detects the rotation of the vane anemometer 38, by detecting the motion of the magnets 42. The sensor 28 may include the electronics to convert the information detected by the sensor 28 to a rotational speed value, such as rotations per minute, and display the rotational speed value, or alternately the sensor 28 may convey raw sensor information via communication means 30 to a larger controller 32 that converts the raw sensor information to a rotational speed value, reports the value, and performs other functions, as described in more detail below. Further, one of either the sensor 28 or the controller 32 preferably converts the information to a velocity or a flow rate of the exhaust stream. Any of this information as detected or calculated can be used in the manner as described below.

For example, it may be empirically determined that when the velocity of the exhaust stream falls below a certain set point, that the degree of photoresist blow back onto the substrate increases. In this case, the controller 32 is programmed to compare the readings received from the sensor 28, whether those readings be raw sensor data or calculated values, to the exhaust stream velocity set point. When the readings from the sensor 28 do not violate the set point, then the controller 32 preferably signals that the photoresist application system 10 is functioning properly in regard to that aspect of the operation of the photoresist application system 10.

However, when the readings from the sensor 28 do violate the set point, then the controller 32 preferably signals that the photoresist application system 10 is not functioning properly in regard to that aspect of the operation of the photoresist application system 10. This signal may take any one or more of a number of different forms. For example, the signal may be an audible signal such as an alarm, or a visual signal such as a warning light. Further, the signal may be an electronic signal to appropriate interlocks on the photoresist application system 10, which interlocks prohibit further application of photoresist to additional substrates 14 until the alarm condition of the exhaust stream is corrected. Additionally, the signal may be a digital data signal that is sent via a computerized network to a management station, which provides data logging for and control of the photoresist application system 10.

Figure 2:
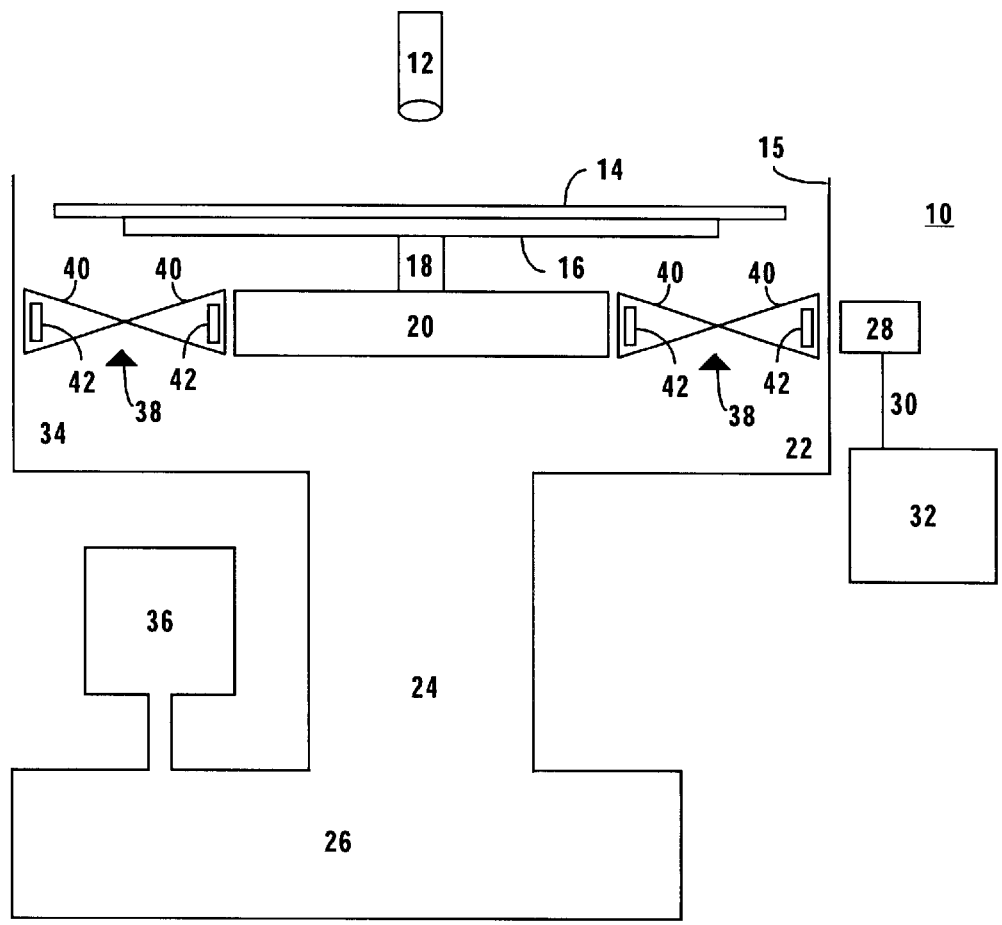
FIG. 2 is a cross sectional view of a photoresist application system according to a second embodiment of the invention.

The placement of the vane anemometer 38 is preferably selected according to the individual flow attributes of the exhaust system 34, according to at least some of the following considerations. For example, if there is a tendency for the blow back to originate within the cup 22 of the exhaust system 34, then placement of the vane anemometer 38 at a position between the substrate 14 and substantial portions of the cup 22 may be preferred, such as depicted in FIG. 2. Also as depicted in FIG. 2, multiple vane anemometers 38 may be preferred, depending upon where they are disposed in the exhaust system 34, so that a substantially complete portion of the cross sectional area of that part of the exhaust system 34 in which the vane anemometers 38 are disposed is occupied by the vane anemometers 38, and a pressure drop across the vane anemometers 38 can be created.

Although the preferred embodiments as described above have been exemplified with the specific recitation of a photoresist application system 10, it is understood that this is by way of example only, and the invention has application to other embodiments where flowable materials are applied to substrates other than semiconductor wafers. Thus, the foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A system for applying a layer of a flowable material to a substrate, the system comprising:

a rotatable chuck for receiving the substrate, a dispensing unit for dispensing an amount of the flowable material onto the substrate, the rotatable chuck further for rotating the substrate and thereby spreading the flowable material across the substrate and conveying a surplus amount of the flowable material away from the substrate, an exhaust system for receiving the surplus amount of the flowable material, a vacuum source for creating an exhaust stream within the exhaust system, the exhaust stream for entraining at least a portion of the surplus amount of the flowable material conveyed away from the substrate and received by the exhaust system, and a vane anemometer disposed within and extending substantially completely across a cross sectional area of the exhaust system, for creating a pressure drop in the exhaust stream across the vane anemometer within the exhaust system and thereby for reducing blow back of the entrained portion of the surplus amount of the flowable material from a downstream position in the exhaust system to the substrate.

2. The system of claim 1 wherein the flowable material further comprises photoresist.

3. The system of claim 1 wherein the vane anemometer further comprises vanes having an external surface that is resistant to adherence of the flowable material.

4. The system of claim 1 wherein the vane anemometer further comprises vanes with tips, wherein the vanes have magnets in the tips.

5. The system of claim 1 further comprising a sensor disposed outside of the exhaust system for detecting a rotational rate of the vane anemometer, producing a signal corresponding to a velocity of the exhaust stream in the exhaust system, and at least one of displaying and conveying the velocity of the exhaust stream in the exhaust system.

6. The system of claim 1 further comprising a sensor disposed outside of the exhaust system for detecting a rotational rate of the vane anemometer, which sensor detects magnets located within vanes of the vane anemometer.

7. The system of claim 1 further comprising:

a sensor disposed outside of the exhaust system for detecting a rotational rate of the vane anemometer, producing a signal corresponding to a velocity of the exhaust stream in the exhaust system, and at least one of displaying and conveying the velocity of the exhaust stream in the exhaust system, and a controller for signaling an alarm condition when the velocity of the exhaust stream in the exhaust system is less than a set point velocity.

8. The system of claim 1 further comprising:

a sensor disposed outside of the exhaust system for detecting a rotational rate of the vane anemometer, producing a signal corresponding to a velocity of the exhaust stream in the exhaust system, and at least one of displaying and conveying the velocity of the exhaust stream in the exhaust system, and a controller for prohibiting the application of the flowable material to additional substrates when the velocity of the exhaust stream in the exhaust system is less than a set point velocity.

9. In combination with a system for applying a layer of a flowable material to a substrate, where the system has a rotatable chuck for receiving the substrate, a dispensing unit for dispensing an amount of the flowable material onto the substrate, the rotatable chuck further for rotating the substrate and thereby spreading the flowable material across the substrate and conveying a surplus amount of the flowable material away from the substrate, an exhaust system for receiving the surplus amount of the flowable material, and a vacuum source for creating an exhaust stream within the exhaust system, the exhaust stream for entraining at least a portion of the surplus amount of the flowable material conveyed away from the substrate and received by the exhaust system, the improvement comprising:

a vane anemometer disposed within and extending substantially completely across a cross sectional area of the exhaust system, for creating a pressure drop in the exhaust stream across the vane anemometer within the exhaust system and thereby for reducing blow back of the entrained portion of the surplus amount of the flowable material from a downstream position in the exhaust system to the substrate, the vane anemometer having blades with tips and magnets in the tips of the blades, a sensor disposed outside of the exhaust system for detecting a rotational rate of the vane anemometer by sensing the movement of the magnets in the tips of the blades of the vane anemometer, and for producing a signal corresponding to a velocity of the exhaust stream in the exhaust system, and at least one of displaying and conveying the velocity of the exhaust stream in the exhaust system, and a controller for signaling an alarm condition when the velocity of the exhaust stream in the exhaust system is not at least equal to a set point velocity.

10. The system of claim 9 wherein the controller further comprises means for sending an electronic signal to interlocks, thereby prohibiting the application of the flowable material to additional substrates when the velocity of the exhaust stream in the exhaust system is less than the set point velocity.

* * * * *